US011318844B2

(12) United States Patent
Tsai et al.

(10) Patent No.: US 11,318,844 B2
(45) Date of Patent: May 3, 2022

(54) ON-BOARD CHARGING DEVICE AND OPERATING METHOD THEREOF

(71) Applicant: DELTA ELECTRONICS, INC., Taoyuan (TW)

(72) Inventors: Sheng-Nan Tsai, Taoyuan (TW); Chia-Cheng Yang, Taoyuan (TW); Meng-Fu Cho, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 696 days.

(21) Appl. No.: 16/191,412

(22) Filed: Nov. 14, 2018

(65) Prior Publication Data

US 2019/0160947 A1 May 30, 2019

Related U.S. Application Data

(60) Provisional application No. 62/590,639, filed on Nov. 26, 2017.

(30) Foreign Application Priority Data

Aug. 31, 2018 (CN) .......................... 201811010198.6

(51) Int. Cl.
*H02J 7/00* (2006.01)
*H02J 7/14* (2006.01)
(Continued)

(52) U.S. Cl.
CPC ........... *B60L 3/0069* (2013.01); *B60L 3/0046* (2013.01); *B60L 53/22* (2019.02);
(Continued)

(58) Field of Classification Search
USPC ......................................... 320/109, 132, 134
See application file for complete search history.

(56) References Cited

U.S. PATENT DOCUMENTS

2009/0195219 A1* 8/2009 Morita .................... B60L 58/13
320/162
2009/0295329 A1* 12/2009 Yugou .................... B60L 58/14
320/116
(Continued)

FOREIGN PATENT DOCUMENTS

CN       103823148 A      5/2014
TW       201619617 A      6/2016
(Continued)

*Primary Examiner* — Alexis B Pacheco
(74) *Attorney, Agent, or Firm* — CKC & Partners Co., LLC

(57) ABSTRACT

An on-board charging device includes an AC connector, an AC to DC converter and a detection circuit. The AC connector is configured to be connected to an electric vehicle supply equipment (EVSE), so that a protective earth terminal of EVSE is electrically connected to a protective earth terminal of the on-board charging device. The AC to DC converter is electrically connected to the AC connector, and the AC to DC converter is configured to convert an AC voltage provided by the EVSE into a DC voltage. The AC to DC converter has a reference ground terminal. The detection circuit outputs a detection voltage based on the voltage difference between the protective earth terminal of the on-board charging device and the reference ground terminal of the AC to DC converter. The detection voltage reflects whether the protective earth terminal of the EVSE is abnormal or not.

15 Claims, 3 Drawing Sheets

(51) Int. Cl.
*B60L 3/00* (2019.01)
*G01R 19/165* (2006.01)
*B60L 53/22* (2019.01)
*H03F 3/45* (2006.01)
*G01R 31/52* (2020.01)

(52) U.S. Cl.
CPC . *G01R 19/16542* (2013.01); *G01R 19/16547* (2013.01); *H03F 3/45475* (2013.01); *B60L 2210/30* (2013.01); *B60L 2240/80* (2013.01); *B60L 2250/10* (2013.01); *G01R 31/52* (2020.01); *H02J 7/0029* (2013.01); *H02J 7/0047* (2013.01); *H03F 3/45* (2013.01); *H03F 2203/45151* (2013.01); *H03F 2203/45156* (2013.01); *H03F 2203/45526* (2013.01)

(56) References Cited

U.S. PATENT DOCUMENTS

| | | | |
|---|---|---|---|
| 2012/0001640 A1* | 1/2012 | Hashimoto | B60L 53/51 324/434 |
| 2013/0169284 A1 | 7/2013 | Flack et al. | |
| 2015/0115874 A1* | 4/2015 | Magnusson | H02J 7/007 320/107 |
| 2016/0139193 A1 | 5/2016 | Wu | |
| 2016/0241060 A1* | 8/2016 | Suzuki | B60L 53/66 |
| 2017/0012422 A1* | 1/2017 | Mizoguchi | H02H 11/005 |
| 2017/0197508 A1* | 7/2017 | Kobayashi | B60L 3/0046 |
| 2017/0272009 A1* | 9/2017 | Kawamura | B60L 3/12 |
| 2017/0334301 A1 | 11/2017 | Wu | |
| 2019/0148957 A1* | 5/2019 | Masuda | B60L 3/04 320/127 |
| 2020/0406774 A1* | 12/2020 | Tsukamoto | B60L 53/66 |

FOREIGN PATENT DOCUMENTS

| | | |
|---|---|---|
| TW | I547052 B | 8/2016 |
| TW | I595722 B | 8/2017 |

* cited by examiner

ON-BOARD CHARGING DEVICE AND OPERATING METHOD THEREOF

RELATED APPLICATIONS

This application claims priority to U.S. provisional application 62/590,639, filed on Nov. 26, 2017, and China application 201811010198.6, filed on Aug. 31, 2018, the entireties of which are herein incorporated by reference.

BACKGROUND

Field of Invention

The present invention relates to devices and methods, and more particularly, an on-board charging device and an operating method thereof.

Description of Related Art

Since fuel-based vehicles were invented, it has improved the convenience of human transportations. With the advancement of technology, fuel-based vehicles have been rapidly mass-produced, so that fuel-based vehicles can be one type of the most dependable tools in human life. Global warming is severe nowadays, causing abnormal climate, so that global energy conservation awareness is increased. However, overuse of fuel-based vehicles needs a large amount of gasoline burnt which causes air pollution, thereby destroying the ecology. Therefore, many countries are actively encouraging the development of new energy vehicles, e.g., electric vehicles or hybrid vehicles, to reduce their dependence on oil.

The rapid spread of electric vehicles is bound to promote the rapid development of electric vehicle supply equipment (EVSE). However, the qualities of ground fault detection in EVSEs around the world are different from each other, and thus, a user may easily get an electric shock while he or she uses the EVSE to charge the electric vehicle.

SUMMARY

The following presents a simplified summary of the disclosure in order to provide a basic understanding to the reader. Concepts disclosed herein are provided in a simplified form and a more detailed description is presented later.

An embodiment of the present disclosure is related to an on-board charging device. The on-board charging device includes an AC connector, an AC to DC converter and a detection circuit. The AC connector is configured to be connected to an electric vehicle supply equipment (EVSE), so that a protective earth terminal of EVSE is electrically connected to a protective earth terminal of the on-board charging device. The AC to DC converter is electrically connected to the AC connector, and the AC to DC converter is configured to convert an AC voltage provided by the EVSE into a DC voltage. The AC to DC converter has a reference ground terminal. The detection circuit outputs a detection voltage based on the voltage difference between the protective earth terminal of the on-board charging device and the reference ground terminal of the AC to DC converter. The detection voltage indicates whether the protective earth terminal of the EVSE is abnormal or not.

In some embodiments, the on-board charging device further includes a controller configured to determine that the protective earth terminal of the EVSE is abnormal when the detection voltage is lower than a predetermined threshold voltage.

In some embodiments, the controller determines that the protective earth terminal of the EVSE is normal when the detection voltage is higher than a predetermined threshold voltage.

In some embodiments, the detection circuit includes a voltage dividing circuit, a buffer, an amplifier and a filter. The voltage dividing circuit is electrically connected to the protective earth terminal of the on-board charging device and the reference ground terminal of the AC to DC converter. The voltage dividing circuit is configured to divide a voltage between the protective earth terminal of the on-board charging device and the reference ground terminal of the AC to DC converter to output a voltage signal. The buffer is electrically connected to the voltage dividing circuit, and the buffer is configured to receive the voltage signal. The amplifier is electrically connected to the buffer, and the amplifier is configured to receive the voltage signal outputted from the buffer. The filter is electrically connected to the amplifier, and the filter is configured to filter the voltage signal amplified by the amplifier to output the detection voltage.

In some embodiments, the voltage dividing circuit includes a first resistor, a second resistor and a filter circuit. The first resistor has one end electrically connected to the protective earth terminal of the on-board charging device. The second resistor is connected in series with the first resistor. One end of the second resistor is electrically connected to the other end of the first resistor, and the other end of the second resistor is electrically connected to the reference ground terminal of the AC to DC converter. The filter circuit is connected in parallel with the second resistor.

In some embodiments, the buffer is a voltage follower.

In some embodiments, the amplifier is a differential amplifier.

In some embodiments, the filter is a low pass filter.

In some embodiments, the on-board charging device further includes an isolation stage, a DC to DC converter and an output filter. The isolation stage is electrically connected to the AC to DC converter. The DC to DC converter is electrically connected to the isolation stage. The output filter is electrically connected to the DC to DC converter. The DC voltage output by the AC to DC converter is converted through the isolation stage and the DC to DC converter and then is filtered by the output filter to provide a vehicle charging voltage for a vehicle.

Another embodiment of the present disclosure is related to an operating method of an on-board charging device, the on-board charging device includes an AC connector and an AC to DC converter, and the operating method includes the following steps. When the AC connector is connected to an electric vehicle supply equipment (EVSE) and a protective earth terminal of the EVSE is electrically connected to a protective earth terminal of the on-board charging device, outputting a detection voltage based on a voltage difference between the protective earth terminal of the on-board charging device and a reference ground terminal of the AC to DC converter. Determining whether the protective earth terminal of the EVSE is abnormal according to the detection voltage.

In some embodiments, the step of determining whether the protective earth terminal of the EVSE is abnormal includes: determining that the protective earth terminal of the EVSE is abnormal when the detection voltage is lower than a predetermined threshold voltage.

In some embodiments, the step of determining whether the protective earth terminal of the EVSE is abnormal includes: determining that the protective earth terminal of the EVSE is normal when the detection voltage is higher than a predetermined threshold voltage.

In some embodiments, the operating method further includes: determining whether an AC voltage provided by the EVSE is higher than a predetermined voltage when the AC connector is connected to the EVSE; and determining whether the AC voltage falls within a first voltage range when the AC voltage provided by the EVSE is higher than the predetermined voltage.

In some embodiments, the step of determining whether the protective earth terminal of the EVSE is abnormal includes: determining whether the detection voltage is lower than a first predetermined threshold voltage when the AC voltage falls within the first voltage range; determining whether the detection voltage continues to be lower than the first predetermined threshold voltage over a first predetermined period; determining that the protective earth terminal of the EVSE is abnormal after the detection voltage continues to be lower than the first predetermined threshold voltage over the first predetermined period.

In some embodiments, the step of determining whether the protective earth terminal of the EVSE is abnormal includes: determining whether the detection voltage is lower than a second predetermined threshold voltage when the AC voltage falls within a second voltage range and not the first voltage range; determining whether the detection voltage continues to be lower than the second predetermined threshold voltage over a second predetermined period; determining that the protective earth terminal of the EVSE is abnormal after the detection voltage continues to be lower than the second predetermined threshold voltage over the second predetermined period.

In view of the foregoing, the present disclosure provides an on-board charging device and an operating method thereof, in which the on-board charging device has capability to detect whether the protective earth terminal of the EVSE is abnormal, for alerting or preventing the dangers of electric shock.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
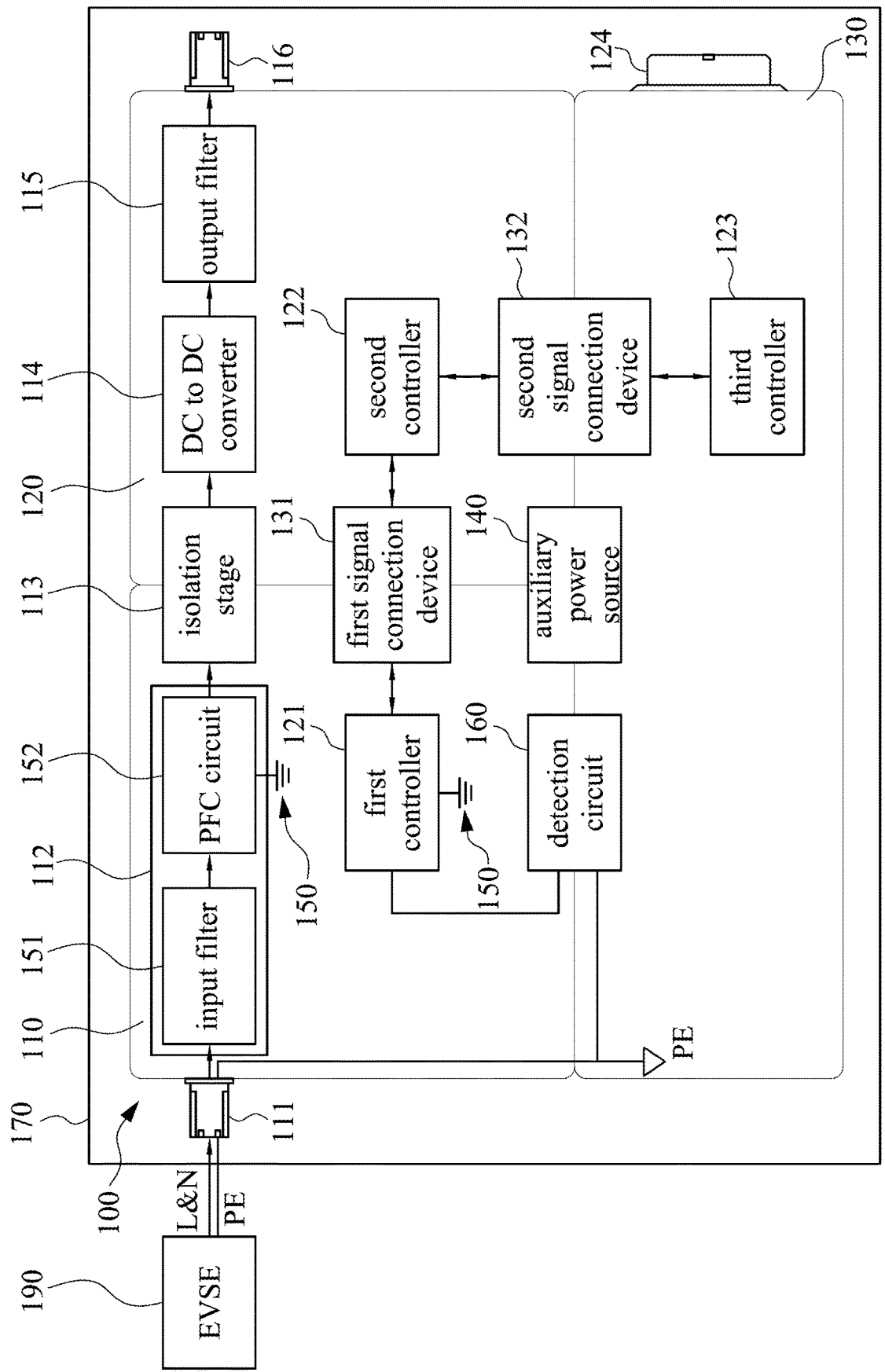
FIG. 1 is a block diagram of an on-board charging device according to some embodiments of the present disclosure.

Reference will now be made in detail to the present embodiments of the invention, examples of which are illustrated in the accompanying drawings. Wherever possible, the same reference numbers are used in the drawings and the description to refer to the same or like parts.

As used in the description herein and throughout the claims that follow, the meaning of "a", "an", and "the" includes reference to the plural unless the context clearly dictates otherwise. Also, as used in the description herein and throughout the claims that follow, the terms "comprise or comprising", "include or including", "have or having", "contain or containing" and the like are to be understood to be open-ended, i.e., to mean including but not limited to. As used in the description herein and throughout the claims that follow, the meaning of "in" includes "in" and "on" unless the context clearly dictates otherwise.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a block diagram of an on-board charging device 100 according to some embodiments of the present disclosure. As shown in FIG. 1, the on-board charging device 100 is adapted to a vehicle 170. For example, the vehicle 170 is an electric vehicle, a hybrid vehicle or the like.

In FIG. 1, the on-board charging device 100 may include an AC connector 111, an AC to DC converter 112, an isolation stage 113, a DC to DC converter 114, an output filter 115, a high voltage connector 116, and a first controller 121, a second controller 122, a third controller 123, a signal connector 124, a first signal connection device 131, a second signal connection device 132, an auxiliary power source 140 and a detection circuit 160. For example, the isolation stage 113 can be an LLC resonant converter, the DC to DC converter 114 can be a buck converter, and the first controller 121, the second controller 122, and the third controller 123 can be respective microcontrollers, the first signal connection device 131 and the second signal connection device 132 can be respective signal connection chips.

In FIG. 1, the AC to DC converter 112 may include an input filter 151, e.g., an electromagnetic interference (EMI) filter and a power factor correction (PFC) circuit 152. As shown, the input filter 151 is electrically connected to the AC connector 111, and the power factor correction circuit 152 is electrically connected to the input filter 151.

In FIG. 1, the AC connector 111, the AC to DC converter 112, the primary side of the isolation stage 113 and the first controller 121 are disposed on the high voltage primary side 110 of the on-board charging device 100. The secondary side of the isolation stage 113, the DC to DC converter 114, the output filter 115, the high voltage connector 116 and the second controller 122 are disposed on the high voltage secondary side 120 of the on-board charging device 100. The third controller 123 and the signal connector 124 are disposed on the low voltage side 130 of the on-board charging device 100.

In use, the auxiliary power source 140 supplies power to the first controller 121, the second controller 122 and the third controller 123, so that the first controller 121, the second controller 122 and the third controller 123 control the respective components in the high voltage primary side 110, the high voltage secondary side 120, and the low voltage side 130, respectively.

The first signal connection device 131 is electrically connected to the first controller 121 of the high voltage primary side 110 and the second controller 122 of the high voltage secondary side 120. The first signal connection device 131 is used for signal transmission between the different voltage sides of the first controller 121 and the second controller 122. The second signal connection device 132 is electrically connected to the second controller 122 of the high voltage secondary side 120 and the third controller 123 of the low voltage side 130. The second signal connection device 132 is used for signal transmission between the different voltage sides of the second controller 122 and the third controller 123.

The high voltage primary side 110 and the high voltage secondary side 120 primarily convert the AC (Alternating Current) voltage provided by the EVSE 190 into a vehicle charging voltage for the vehicle 170.

As shown, the AC connector 111 is electrically connected to the AC to DC converter 112. The AC to DC converter 112 is electrically connected to the isolation stage 113. The isolation stage 113 is electrically connected to the DC to DC converter 114. The DC to DC converter 114 is electrically connected to the output filter 115. The output filter 115 is electrically connected to the high voltage connector 116.

In the configuration of which the AC connector 111 and the EVSE 190 are connected, the AC to DC converter 112 converts the AC voltage supplied by the EVSE 190 into a DC (Direct Current) voltage, and the DC voltage output from the AC to DC converter 112. The DC voltage output by the AC to DC converter 112 is converted through the isolation stage 113 and the DC to DC converter 114 and then is filtered by the output filter 115 to provide the vehicle charging voltage. The high voltage connector 116 outputs the vehicle charging voltage to the vehicle. It should be noted that the isolation stage 113 and the DC to DC converter 114 can be two independent power converters; for example, the isolation stage 113 can be an LLC resonant converter, and the DC to DC converter 114 can be a buck converter. Alternatively, the isolation stage 113 and the DC to DC converter 114 can also be replaced with a primary power converter, for example, the isolation stage 113 and the DC to DC converter 114 can be replaced with a primary LLC resonant converter to provide a stable output. It is envisaged that the present disclosure includes embodiments which those with ordinary skill in the art may flexibly design the converter depending on the desired application. The LLC resonant converter can also be replaced by a full bridge phase shift converter or anther converter.

Specifically, the EVSE 190 has a live line L, a neutral line N, and a protective earth terminal PE. In the configuration of which the AC connector 111 is connected to the EVSE 190, the AC connector 111 is connected to the live wire L, the neutral line N and the protective earth terminal PE, such that the protective earth terminal PE of the EVSE 190 is electrically connected to the protective earth terminal PE of the on-board charging device 100. The AC to DC converter 112 receives the AC voltage from the live line L and the neutral line N through the AC connector 111, and converts the AC voltage into the DC voltage. The AC to DC converter 112 has a reference ground terminal 150. The reference ground terminal 150 is used as a voltage reference level for voltage detection and control of the AC to DC converter 112; for example, the reference ground terminal 150 can be a negative end of the DC output voltage of the AC to DC converter 112.

It should be noted that the protective earth terminal PE of the EVSE 190 and the reference ground terminal 150 of the AC to DC converter 112 are different ground terminals. In power supply system application, the exposed and conductive parts of the device are usually connected to the protective earth terminal PE, to form an equipotential system. Referring to FIG. 1, the protective earth terminal PE of the on-board charging device 100 is electrically connected to the protective earth terminal PE of the EVSE 190 through the AC connector 111 to achieve good grounding. The reference ground terminal 150 is a primary side reference ground of the high voltage primary side 110 of the on-board charging device 100.

However, the qualities of ground fault detection in EVSEs around the world are different from each other. To prevent dangers from electric shock when using the EVSE 190 to charge the vehicle 170, the detection circuit 160 outputs a detection voltage based on a voltage difference between the protective earth terminal PE of the on-board charging device 100 and the reference ground terminal 150 of the AC to DC converter 112, in which the detection voltage reflects whether the protective earth terminal PE of the EVSE 190 is abnormal. The so-called abnormality refers to whether the protective earth terminal PE has a good connection with the earth. Further, as described above, the protective earth terminal PE of the on-board charging device 100 is electrically connected to the protective earth terminal PE of the EVSE 190 through the AC connector 111, so that the detection circuit 160 can select the protective earth terminal PE of the on-board charging device 100 to serve as a detection point.

In one embodiment, the detection circuit 160 outputs the detection voltage to the first controller 121 of the high voltage primary side 110. The first controller 121 transmits, through the first signal connection device 131, the value of the detection voltage to the second controller 122 of the high voltage secondary side 120. The second controller 122 transmits, through the second signal connection device 132, the value of the detection voltage to the third controller 123 of the low voltage side 130. The third controller 123 makes a determination based on the detection voltage and a predetermined threshold voltage. For example, the third controller 123 determines whether the detection voltage is lower than a predetermined threshold voltage. When the detection voltage is lower than the predetermined threshold voltage, the third controller 123 determines that the protective earth terminal PE of the EVSE 190 is abnormal. When the detection voltage is higher than the predetermined threshold voltage, the third controller 123 determines that the protective earth terminal PE of the EVSE 190 is normal.

In another embodiment, the first controller 121 or the second controller 122 can determine whether the detection voltage is lower than the predetermined threshold voltage. It is envisaged that the present disclosure includes embodiments which those with ordinary skill in the art may flexibly choose the controller depending on the desired application.

It should be noted that a system designer can preset the predetermined threshold voltage in the controller (e.g., the first controller 121, the second controller 122, and/or the third controller 123) according to his or her knowledge of abnormality condition and/or the parameter of the device components. Alternatively, the user may flexibly adjust the predetermined threshold voltage. For example, the system designer can determine that the ground impedance greater than a certain value is an abnormality, and adjust the predetermined threshold voltage accordingly.

If the protective earth terminal PE of the EVSE 190 is determined to be abnormal, the third controller 123 can, for example, output an abnormal signal to the vehicle 170 through the signal connector 124, so that the vehicle 170 can perform a corresponding warning action (e.g., warning sound, warning images, vibration, etc.) to alert the user, thereby reducing the risk of the electric shock. Alternatively, the first controller 121 can turn off the AC to DC converter 112 when the protective earth terminal PE of the EVSE 190 is abnormal.

The concept and principle of the present disclosure are further described below. When the AC connector 111 is connected to the EVSE 190, the AC to DC converter 112 receives the AC voltage from the live line L and the neutral line N, and converts the AC voltage into the DC voltage. The AC voltage forms a loop with alternating positive and negative half cycles, and therefore the electric potential of the reference ground terminal 150 of the AC to DC converter 112 is the same as the electric potential of the live line L or the neutral line N alternately.

When the protective earth terminal PE of the EVSE 190 is grounded normally, a voltage difference exists between the live line L or the neutral line N and the protective earth terminal PE. Correspondingly, a voltage difference exists between the protective earth terminal PE and the reference ground terminal 150. The aforementioned voltage differences are related to a voltage difference between the live line L and the neutral line N.

When the protective earth terminal PE of the EVSE 190 has a grounding abnormality, for example, the grounding terminal PE of the electric vehicle charging device 190 is disconnected from the earth, there is no (or negligible) voltage difference between the protective earth terminal PE and the live line L or the neutral line N. Correspondingly, there is no (or negligible) voltage difference between the protective earth terminal PE and the reference ground terminal 150. Thus, the detection circuit 160 is configured to output a detection voltage according to a voltage difference between the protective earth terminal PE of the on-board charging device 100 and the reference ground terminal 150 of the AC to DC converter 112, in which the detection voltage reflects whether the protective earth terminal PE of the EVSE 190 is abnormal.

Figure 2:
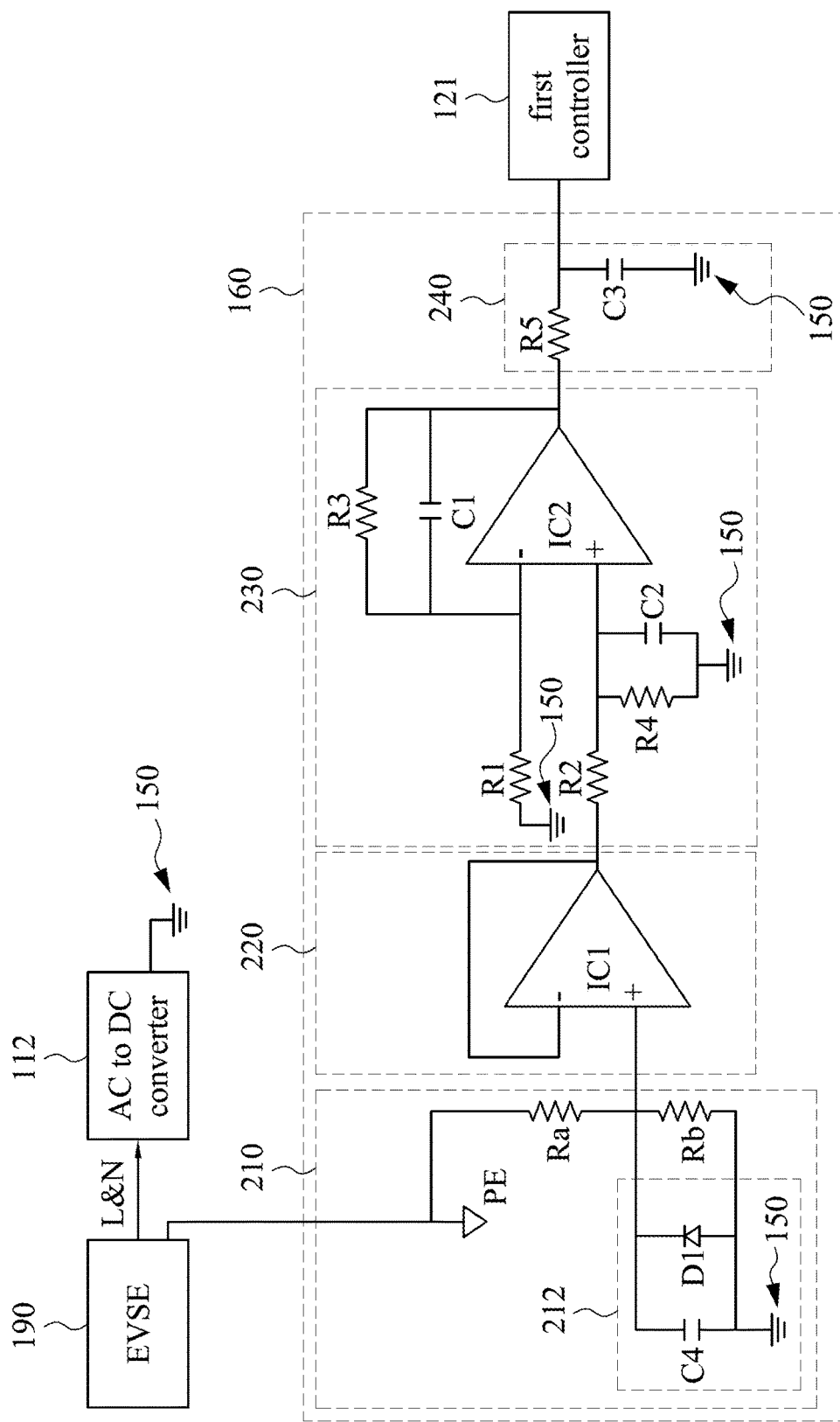
FIG. 2 is a circuit diagram of a detection circuit according to some embodiments of the present disclosure.

For further understanding of the detection circuit 160, refer to FIGS. 1-2. FIG. 2 is a circuit diagram of the detection circuit 160 according to some embodiments of the present disclosure. As shown in FIG. 2, the detection circuit 160 includes a voltage dividing circuit 210, a buffer 220, an amplifier 230 and a filter 240.

As shown, the buffer 220 is electrically connected to the voltage dividing circuit 210, the amplifier 230 is electrically connected to the buffer 220, and the filter 240 is electrically connected to the amplifier 230. One end of the voltage dividing circuit 210 is electrically connected to the reference ground terminal 150 of the AC to DC converter 112, and another end of the voltage dividing circuit 210 is electrically connected to the protective earth terminal PE of the on-board charging device 100. The voltage dividing circuit 210 is configured to divide a voltage between the protective earth terminal PE of the on-board charging device 100 and the reference ground terminal 150 of the AC to DC converter 112 to output a voltage signal. The buffer 220 receives the voltage signal. The amplifier 230 receives the voltage signal outputted from the buffer 220. The filter 240 filters the voltage signal amplified by the amplifier 230 to output the detection voltage.

In FIG. 2, the voltage dividing circuit 210 includes a first resistor Ra, a second resistor Rb and a filter circuit 212. One end of the first resistor Ra is electrically connected to the protective earth terminal PE of the on-board charging device 100. The second resistor Rb is connected in series with the first resistor Ra. One end of the second resistor Rb is electrically connected to the other end of the first resistor Ra, and the other end of the second resistor Rb is electrically connected to the reference ground terminal 150 of the AC to DC converter 112. The filter circuit 212 is connected in parallel with the second resistor Rb.

In one embodiment, as shown in FIG. 2, the filter circuit 212 includes a capacitor C4 and a diode D1. One end of the second resistor Rb is electrically connected to the first resistor Ra, the cathode of the diode D1 and one end of the capacitor C4, and the other end of the second resistor Rb is electrically connected to the reference ground terminal 150 of the AC to DC converter 112, the anode of diode D1 and the other end of capacitor C4. The capacitor C4 is used to suppress noise, and the diode D1 is a clamp diode to protect circuitry.

In one embodiment, the buffer 220 is a voltage follower. As shown in FIG. 2, the buffer 220 includes a first operational amplifier IC1. The output terminal of the first operational amplifier IC1 is electrically connected to the inverting input terminal of the first operational amplifier IC1. The non-inverting input terminal of the first operational amplifier IC1 receives the voltage signal output from the voltage dividing circuit 210. The output impedance of the first operational amplifier IC1 is substantially zero, so as to eliminate the effect of the first resistor Ra and the second resistor Rb to the input impedance of the amplifier 230.

In one embodiment, the amplifier 230 is a differential amplifier. As shown in FIG. 2, the amplifier 230 includes a second operational amplifier IC2, resistors R1 to R4, and capacitors C1 and C2. The two ends of the resistor R1 are electrically connected to the reference ground terminal 150 and the inverting input terminal of the second operational amplifier IC2, respectively. The two ends of the resistor R2 are electrically connected to the output terminal of the first operational amplifier IC1 and the non-inverting input terminal of the second operational amplifier IC2, respectively. The two ends of the resistor R3 are electrically connected to the inverting input terminal of the second operational amplifier IC2 and the output terminal of the second operational amplifier IC2, respectively. The two ends of the resistor R4 are electrically connected to the non-inverting input terminal of the second operational amplifier IC2 and the reference ground terminal 150, respectively. The two ends of the capacitor C1 are electrically connected to the inverting input terminal of the second operational amplifier IC2 and the output terminal of the second operational amplifier IC2, respectively. The two ends of the capacitor C2 are electrically connected to the non-inverting input terminal of the second operational amplifier IC2 and the reference ground terminal 150, respectively. In use, the voltage signal is amplified by the second operational amplifier IC2.

In one embodiment, the filter 240 is a low pass filter. As shown in FIG. 2, the filter 240 includes a resistor R5 and a capacitor C3. The two ends of the resistor R5 are electrically connected to the output terminal of the second operational amplifier IC2 and the first controller 121, respectively. The two ends of the capacitor C3 are electrically connected to the first controller 121 and the reference ground terminal 150, respectively. In use, the voltage level of the amplified voltage signal is smoothed by the filter 240 to facilitate the measurement by the first controller 121. It should be noted that the concept of the present disclosure provides a detection circuit to detect the voltage difference between the protective earth terminal and the reference ground terminal, and to indicate whether the protective earth terminal of the EVSE is abnormal or not. The circuitry as shown in FIG. 2 is an example only, and the structure of the detection circuit is not limited thereto. It is envisaged that the present disclosure includes embodiments which those with ordinary skill in the art may flexibly design the detection circuit depending on the desired application.

Figure 3:
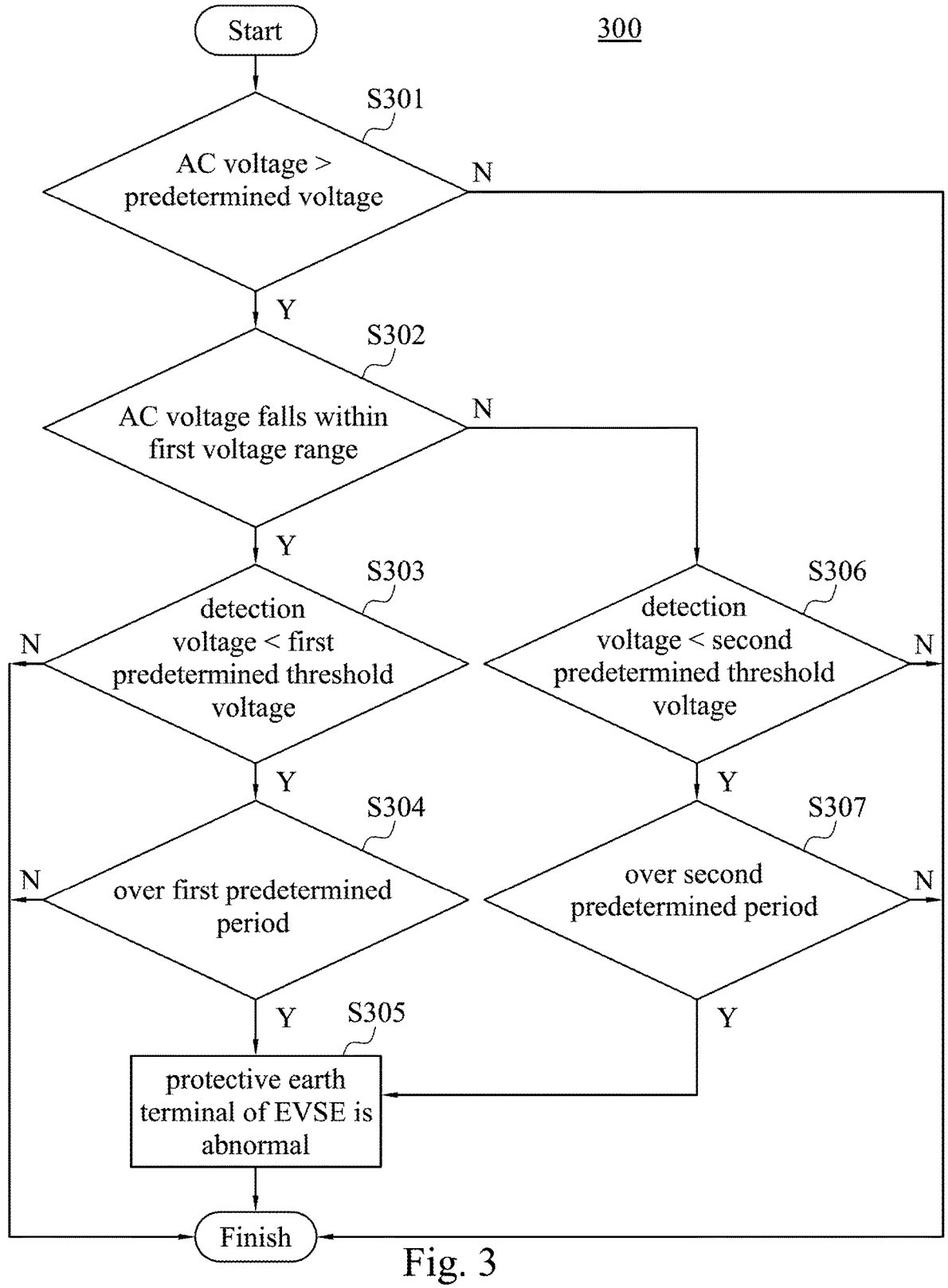
FIG. 3 is a flow chart of an operating method of the on-board charging device according to some embodiments of the present disclosure.

For further understanding of a method operated by the on-board charging device 100, refer to FIGS. 1-3, FIG. 3 is a flow chart of an operating method 300 of the on-board charging device 100 according to some embodiments of the present disclosure. In the operating method 300, in the configuration of which the AC connector 111 is connected to EVSE 190, the protective earth terminal PE of the EVSE 190 is electrically connected to the protective earth terminal PE of the on-board charging device 100, where the electric potential of the protective earth terminal PE of the EVSE 190 is substantially equal to the protective earth terminal PE of the on-board charging device 100. The detection voltage according to the voltage difference between a protective earth terminal PE of the on-board charging device 100 and the reference ground terminal 150 of the AC to DC converter 112 is output, and a determination is made as to whether the protective earth terminal PE of the EVSE 190 is abnormal according to the detection voltage. For example, if the detection voltage is lower than the predetermined threshold voltage, it is determined that the protective earth terminal PE of the EVSE 190 is abnormal. Alternatively, if the detection voltage is higher than the predetermined threshold voltage, it is determined that the protective earth terminal PE of the EVSE 190 is normal.

FIG. 3 shows an example operating method 300, which includes steps S301-S307. As could be appreciated by persons having ordinary skill in the art, for the steps described in the present embodiment, the sequence in which these steps is performed, unless explicitly stated otherwise, can be altered depending on desired implementation. In some implementations, all or some of these steps can be performed concurrently.

Refer to FIG. 3. At step S301, determine whether the AC voltage provided by the EVSE 190 is higher than a predetermined voltage when the AC connector 111 is connected to EVSE 190. If the AC voltage provided by the EVSE 190 is higher than the predetermined voltage, the EVSE 190 outputs a normal AC voltage. If the AC voltage provided by the EVSE 190 is lower than the predetermined voltage, the EVSE 190 outputs an abnormal voltage or does not output a voltage (so that the vehicle 170 cannot be charged) and the operating method 300 is finished. For example, the predetermined voltage can be about 80V and the normal AC voltage is about 110V or about 220V, but the present disclosure is not limited thereto.

At step S302, determine whether the AC voltage falls within a first voltage range. If the AC voltage falls within the first voltage range, then at step S303, determine whether the detection voltage is lower than a first predetermined threshold voltage. If the detection voltage is lower than the first predetermined threshold voltage, then at step S304, determine whether the detection voltage continues to be lower than the first predetermined threshold voltage over a first predetermined period (for avoiding a misjudgment). If the detection voltage continues to be lower than the first predetermined threshold voltage over the first predetermined period, then at step S305, determine that the protective earth terminal PE of the EVSE 190 is abnormal.

At step S302, if the AC voltage falls within a second voltage range rather than the first voltage range, then at step S306, determine whether the detection voltage is lower than a second predetermined threshold voltage. If the detection voltage is lower than the second predetermined threshold voltage, then at step S307, determine whether the detection voltage continues to be lower than the second predetermined threshold voltage over a second predetermined period (for avoiding a misjudgment). If the detection voltage continues to be lower than the second predetermined threshold voltage over the second predetermined period, then at step S305, determine that the protective earth terminal PE of the EVSE 190 is abnormal.

It should be noted that the second voltage range is different from the first voltage range. For example, the first voltage range can be approximately 90-132 V (conventionally 110 V), and the second voltage range can be approximately 200-240 V (conventionally 220 V). Alternatively, the first voltage range can be approximately 200-240 V (conventionally 220 V), and the second voltage range can be approximately 90-132 V (conventionally 110 V). It is envisaged that the present disclosure includes embodiments which those with ordinary skill in the art may flexibly adjust the voltage range depending on the desired application.

As described above, the voltage difference between the protective earth terminal PE and the reference ground terminal 150 is related to the voltage difference between the live line L and the neutral line N, so that different predetermined threshold voltage can be selected according to different voltage range of the AC voltage. For example, the first voltage range can be approximately 90-132 V, and the first predetermined threshold voltage can be about 0.45 V. In another example, the second voltage range can be approximately 200-240 V, and the second predetermined threshold voltage can be about 0.9 V. Alternatively, the first voltage range can be approximately 200-240 V, and the first predetermined threshold voltage can be about 0.9 V. Alternatively, the second voltage range can be approximately 90-132 V, and the second predetermined threshold voltage can be about 0.45 V.

It should be noted that the values of the above voltage ranges and the above predetermined threshold voltages are merely examples. In practice, a system designer can preset the predetermined threshold voltage in the controller (e.g., the first controller 121, the second controller 122, and/or the third controller 123) according to his or her knowledge of abnormality condition and/or the parameter of the device components. Alternatively, the user may flexibly adjust the predetermined threshold voltage.

In view of the above, the present disclosure provides an on-board charging device 100 and an operating method 300 thereof, in which the on-board charging device 100 has capability to detect whether the protective earth terminal PE of the EVSE 190 is abnormal, for alerting or preventing the dangers of electric shock.

It will be apparent to those skilled in the art that various modifications and variations can be made to the structure of the present invention without departing from the scope of the invention. In view of the foregoing, it is intended that the present invention cover modifications and variations of this invention provided they fall within the scope of the following claims.

What is claimed is:

1. An on-board charging device, comprising:
an AC connector configured to be connected to an electric vehicle supply equipment (EVSE), so that a protective earth terminal of the EVSE is electrically connected to a protective earth terminal of the on-board charging device;
an AC to DC converter electrically connected to the AC connector, the AC to DC converter being configured to convert an AC voltage provided by the EVSE into a DC voltage, wherein the AC to DC converter comprises a reference ground terminal serving as a voltage reference level for a voltage detection and a control of the AC to DC converter; and
a detection circuit configured to output a detection voltage based on a voltage difference between the protective earth terminal of the on-board charging device and the reference ground terminal of the AC to DC converter, wherein the detection voltage is configured to indicate whether the protective earth terminal of the EVSE is abnormal.

2. The on-board charging device of claim 1, further comprising:
a controller configured to determine that the protective earth terminal of the EVSE is abnormal when the detection voltage is lower than a predetermined threshold voltage.

3. The on-board charging device of claim 2, wherein the controller determines that the protective earth terminal of the EVSE is normal when the detection voltage is higher than a predetermined threshold voltage.

4. The on-board charging device of claim 1, wherein the detection circuit comprises:
a voltage dividing circuit electrically connected to the protective earth terminal of the on-board charging device and the reference ground terminal of the AC to DC converter, wherein the voltage dividing circuit is configured to divide a voltage between the protective earth terminal of the on-board charging device and the reference ground terminal of the AC to DC converter to output a voltage signal;
a buffer electrically connected to the voltage dividing circuit, the buffer being configured to receive the voltage signal;
an amplifier electrically connected to the buffer, the amplifier being configured to receive the voltage signal outputted from the buffer; and
a filter electrically connected to the amplifier, the filter being configured to filter the voltage signal amplified by the amplifier to output the detection voltage.

5. The on-board charging device of claim 4, wherein the voltage dividing circuit comprises:
a first resistor comprising one end electrically connected to the protective earth terminal of the on-board charging device;
a second resistor connected in series with the first resistor, wherein one end of the second resistor is electrically connected to an other end of the first resistor, and wherein an other end of the second resistor electrically connected to the reference ground terminal of the AC to DC converter; and
a filter circuit connected in parallel with the second resistor.

6. The on-board charging device of claim 4, wherein the buffer is a voltage follower.

7. The on-board charging device of claim 4, wherein the amplifier is a differential amplifier.

8. The on-board charging device of claim 4, wherein the filter is a low pass filter.

9. The on-board charging device of claim 1, further comprising:
an isolation stage electrically connected to the AC to DC converter;
a DC to DC converter electrically connected to the isolation stage; and
an output filter electrically connected to the DC to DC converter, wherein the DC voltage output by the AC to DC converter is converted through the isolation stage and the DC to DC converter and then is filtered by the output filter to provide a vehicle charging voltage for a vehicle.

10. An operating method of an on-board charging device, the on-board charging device comprising an AC connector and an AC to DC converter, the operating method comprising steps of:
when the AC connector is connected to an electric vehicle supply equipment (EVSE) and a protective earth terminal of the EVSE is electrically connected to a protective earth terminal of the on-board charging device, outputting a detection voltage based on a voltage difference between the protective earth terminal of the on-board charging device and a reference ground terminal of the AC to DC converter, wherein the reference ground terminal serves as a voltage reference level for a voltage detection and a control of the AC to DC converter; and
determining whether the protective earth terminal of the EVSE is abnormal according to the detection voltage.

11. The operating method of claim 10, wherein the step of determining whether the protective earth terminal of the EVSE is abnormal comprises:
determining that the protective earth terminal of the EVSE is abnormal when the detection voltage is lower than a predetermined threshold voltage.

12. The operating method of claim 10, wherein the step of determining whether the protective earth terminal of the EVSE is abnormal comprises:
determining that the protective earth terminal of the EVSE is normal when the detection voltage is higher than a predetermined threshold voltage.

13. The operating method of claim 10, further comprising:
determining whether an AC voltage provided by the EVSE is higher than a predetermined voltage when the AC connector is connected to the EVSE; and
determining whether the AC voltage falls within a first voltage range when the AC voltage provided by the EVSE is higher than the predetermined voltage.

14. The operating method of claim 13, wherein the step of determining whether the protective earth terminal of the EVSE is abnormal comprises:
determining whether the detection voltage is lower than a first predetermined threshold voltage when the AC voltage falls within the first voltage range;

determining whether the detection voltage continues to be lower than the first predetermined threshold voltage over a first predetermined period; and determining that the protective earth terminal of the EVSE is abnormal after the detection voltage continues to be lower than the first predetermined threshold voltage over the first predetermined period.

15. The operating method of claim 13, wherein the step of determining whether the protective earth terminal of the EVSE is abnormal comprises:

determining whether the detection voltage is lower than a second predetermined threshold voltage when the AC voltage falls within a second voltage range and not the first voltage range;

determining whether the detection voltage continues to be lower than the second predetermined threshold voltage over a second predetermined period; and determining that the protective earth terminal of the EVSE is abnormal after the detection voltage continues to be lower than the second predetermined threshold voltage over the second predetermined period.

\* \* \* \* \*